United States Patent [19]
Mantani et al.

[11] Patent Number: 5,345,181
[45] Date of Patent: Sep. 6, 1994

[54] CIRCUIT FOR A DETECTING STATE OF CONDUCTION OF CURRENT THROUGH A SOLENOID

[75] Inventors: Rokurota Mantani; Yasutoshi Kaneko; Takashi Tamaki, all of Hamamatsu, Japan

[73] Assignee: Yamaha Corporation, Japan

[21] Appl. No.: 914,785

[22] Filed: Jul. 16, 1992

[30] Foreign Application Priority Data

Jul. 19, 1991 [JP] Japan .................................. 3-179995
Nov. 29, 1991 [JP] Japan .................................. 3-317060

[51] Int. Cl.⁵ ...................... G01R 31/06; G01R 31/02
[52] U.S. Cl. .................................... 324/546; 324/418; 340/644
[58] Field of Search ............... 324/415, 418, 419, 424, 324/537, 545, 546; 340/644

[56] References Cited

U.S. PATENT DOCUMENTS 4,746,869  5/1988  Schrag et al. ........................ 324/546
5,065,101  11/1991  Ledbetter ............................ 324/415

Primary Examiner—Walter E. Snow
Attorney, Agent, or Firm—Graham & James

[57] ABSTRACT

A circuit is provided for detecting abnormal conduction of current conducted through a solenoid in response to the pulse width modulation signal. The circuit includes a measuring means, for detecting conduction current conducted through the solenoid in response to the pulse width modulation signal and measuring continuous conduction time of the conduction current, and determining means, for determining a conduction to be an abnormal conduction when the continuous conduction time is longer than a predetermined time. Thus, the circuit can be miniaturized and the accuracy of the circuit is not affected by the accuracy of its components. And, the circuit is capable of detecting the half short state of the transistor driving the solenoid and not malfunctioning even if tile power is turned off.

2 Claims, 6 Drawing Sheets

CIRCUIT FOR A DETECTING STATE OF CONDUCTION OF CURRENT THROUGH A SOLENOID

BACKGROUND OF THE INVENTION

1. Field of the Invention

The present invention relates to a solenoid driving circuit for conducting current through a solenoid to drive the solenoid driving a key or a pedal of an automatic performance piano in response to a pulse width modulation signal and more particularly, to a circuit for detecting abnormal conduction of current conducted through the solenoid.

2. Background Art

Circuits for detecting abnormal conduction of current conducted through a solenoid are conventionally known. For example, a circuit (hereafter referred to as detecting circuit (1)) having a design such as that shown in FIG. 6 is available. In the illustrated circuit, an input terminal 1 is provided, to which a pulse width modulation signal is supplied. The input terminal 1 connects to one terminal of an input resister 2. The other terminal of the input resister 2 connects to the base of a switching transistor 3 turned on or off in response to the pulse width modulation signal. The collector of the transistor 3 is connected to one terminal of a solenoid 4, to an anode of a diode 5 and to a cathode of a diode 6. Current is conducted through the solenoid 4 in response to the pulse width modulation signal, whereby the solenoid 4 drives a key or a pedal of an automatic performance piano. The diode 5 is a protector for protecting the solenoid 4. The other terminal of the solenoid 4 connects to a cathode of the diode 5 and a power supply voltage, for example, 100 V is applied thereto. The set of elements 1 through 6 described above is provided in response to the number of keys and pedals, for example, about 90. Diode $6_a$ through $6_c$ show that elements 1 through 6 connect to the terminal a in parallel.

The cathode of a diode 7 connects to the terminal a. The anode of the diode 7 connects to a terminal b by which one terminal of resistors 8 and 9 are connected to each other. To the other terminal of resistor 8 a power supply voltage of, for example, 5 V is applied. The other terminal of the resistor 9 connects to the one terminal of a resistor 10. The resistors 9 and 10 divide the voltage appearing in the terminal b. The one terminal of the resistor 10 connects to the one terminal of a resistor 11 and to the anode of a diode 12. The other terminal of the resistor 11 is connected to a cathode of the diode 12, to one terminal of a capacitor 13 and to a pulse input terminal of a comparator 14. The other terminal of the capacitor 13 connects to the earth. Each of elements 11 through 13 described above together form an analog integral circuit having a time constant of approximately a few seconds. A reference voltage $V_{ref}$ is applied to the minus input terminal of comparator 14. The one terminal of resistor 15 connects to an output terminal of the comparator 14. The resistor 15 is a pull-up resistor and has a power supply voltage of, for example, 5 V applied to its other terminal. An output terminal 16 for the detecting circuit (1) as a whole is provided, output terminal 16 being connected to the output terminal of the comparator 14, as well as with one terminal of resistor 15.

With the detecting circuit (1) as described above, when the pulse width modulation signal as shown in FIG. 7 is supplied to the input terminal 1, the transistor 3 is turned on or off in response to it, whereby the transistor 3 allows the current to be conducted through the solenoid 4 while the pulse width modulation signal supplied to the input terminal 1 is in high state.

Because of the features described in the preceding paragraph, a collector voltage of the transistor 3 is varied as shown in FIG. 8. As a result, until the collector voltage of the transistor 3 decreases to less than 5 V, the diodes 6 and 7 are conductive. Accordingly, the voltage appearing in the terminal b is divided by the resistors 9 and 10, and then, is integrated by the analog integral circuit. The integrated result in the analog integral circuit is compared with the reference voltage $V_{ref}$ by the comparator 14.

Accordingly, when a voltage appearing in the pulse input terminal of the comparator 14 and corresponding to a conductive state wherein the collector voltage of the transistor 3 is less than 5 V is less than the standard voltage $V_{ref}$, an "L" level abnormal conduction detecting signal, indicating abnormal conduction, is output from the output terminal 16.

Next, FIG. 9 illustrates an other conventional circuit (hereafter referred to as detecting circuit (2)) for detecting abnormal conduction of the current conducted through the solenoid. In the illustrated circuit, a pulse width modulation signal generating circuit 17 generates the pulse width modulation signal. The output terminal of the pulse width modulation signal generating circuit 17 connects to one terminal of a resister 18. The other terminal of the resistor 18 connects to one terminal of a resistor 19 and the base of a transistor 20. The resistors 18 and 19 divide the voltage appearing in the output terminal of the pulse width modulation signal generating circuit 17. The transistor 20 connects to a transistor 21 with a darlington connection. The transistors 20 and 21 are turned on or off in response to the pulse width modulation signal. Collectors of the transistors 20 and 21 are connected to one terminal of a solenoid 22, to an anode of a diode 23, to one terminal of a capacitor 24 and to a cathode of a diode 25. Current is conducted through the solenoid 22 in response to the pulse width modulation signal, whereby the solenoid 22 drives a key or a pedal of an automatic performance piano. The diode 23 is a protector for protecting the solenoid 22. The capacitor 24 is a noise reducer for reducing noise generated in the solenoid 22. The other terminal of the solenoid 22 connects to a cathode of the diode 23 and to tile other terminal of the capacitor 24, and a power supply voltage $V_{DD}$ is applied thereto. The set of elements 17 through 25 described above is provided In response to the number of keys and pedals, for example, about 90. Diode $25_a$ through $25_c$ indicate that elements 17 through 25 are connected to the terminal b in parallel.

An cathode of a diode 26 connects to the terminal b. The anode of the diode 26 connects to one terminal of resistor 27. The other terminal of the resistor 27 connects to a terminal c via which one terminal of resistors 28 and 29 are connected to each other. A power supply voltage $V_{cc}$ is applied to the other terminal of resistor 28. The terminal c connects to one terminal of a resistor 30 and to the anode of a diode 31. The other terminal of the resistor 30 connects to the cathode of the diode 31, to one terminal of a capacitor 32 and to a pulse input terminal of a comparator 33. The other terminal of the capacitor 32 connects to the earth. Each of elements 30 through 32 described above together form an analog integral circuit having a time constant of approximately a few seconds. A power supply voltage $V_{cc}$ is applied to one terminal of the resistor 34. The other terminal of resistor 34 is connected to one terminal of a resistor 35 and to one terminal of a capacitor 36. The resistors 34 and 35 divide the power supply voltage $V_{cc}$. The other terminal of the capacitor 36 connects to the earth. The result voltage divided by the resistors 34 and 35, namely, a reference voltage $V_{ref}$ is applied to the minus input terminal of comparator 33. An output terminal 37 for the detecting circuit (2) as a whole is provided, and is connected to an output terminal of the comparator 33.

The value of the resistor 27 is, for example, designed to be about a hundredth of the value of the resistor 29; the value of the resistor 28 is, for example, designed to be about a twentieth of the value of the resistor 29; and the value of the resistor 30 is, for example, designed to be about twice of the value of the resistor 29.

In this case, the power supply voltage $V_{DD}$ and $V_{cc}$ are designed to be 120 V and 5 V, respectively, and the value of the resistors 27 through 30, 34 and 35 are designed to be 1 kΩ, 4.7 kΩ, 100 kΩ, 220 kΩ, 12 kΩ and 10 k Ω, respectively. The value of the capacitor 32 is designed to be 10 μF.

With the detecting circuit (2) as described above, when a pulse width modulation signal is generated by the pulse width modulation signal generating circuit 17, the transistors 20 and 21 are turned on or off in response to it and the transistors 20 and 21 thereby allow the current to conduct through the solenoid 22 while the pulse width modulation signal is in high state.

In this case, because electric potential at terminal a, namely, collector electric potential of the transistor 21, becomes approximately equal to the value of the power supply voltage $V_{DD}$ (120 V), and electric potential at terminal c becomes approximately equal to the result value of the power supply voltage $V_{cc}$ (5 V) divided by the resistors 28 and 29 that is about 4.78 V while the transistor 21 is turned off, the diodes 25 and 26 become nonconductive.

Accordingly, in response to electric potential across both ends of the resistor 28, the diode 31 and the capacitor 32 are serially-connected, that is, in response to the power supply voltage $V_{cc}$ (5 V), electric charge is accumulated in the capacitor 32. In this case, charge time is approximately equal to the time constant determined by the value of the resistor 28 and the capacitor 32, respectively.

In contrast, because the electric potential at terminal namely, the collector electric potential of the transistor 21, becomes approximately equal to 0 V, but the electric potential at terminal c remains unchanged, approximately equal to the result value of the power supply voltage $V_{cc}$ (5 V) divided by the resistors 28 and 29, that is, about 4.78 V while the transistor 21 is turned on, the diodes 25 and 26 become conductive.

Accordingly, because the electric potential at terminal c becomes approximately equal to the result value of the power supply voltage $V_{cc}$ (5 V) divided by the resistors 27 and 28, that is, about 0.87 V, electric charge in the capacitor 32 while the transistor 21 is turned off is discharged via the resistors 30 and 27, the diodes 26 and 25 and the transistor 21. In this case, discharge time is approximately equal to the time constant determined by the value of the resistor 30 and the capacitor 32, respectively.

In the normal case, since the charge and discharge operation in the capacitor 32 described above are alternately repeated in response to the pulse width modulation signal from the pulse width modulation signal generating circuit 17, the electric potential of the capacitor 32 is always higher than the predetermined reference voltage $V_{ref}$ (about 2.7 V). Consequently, a signal representative of the normal conduction of the current conducted through the solenoid 22 is supplied to the output terminal 37 in high state.

However, if, for whatever reason, short state or turn-on state in the transistor 21 continues, namely tile current continues conducting through the solenoid 22 for long time, since tile discharge time of the capacitor 32 becomes longer than in normal state, the electric potential of the capacitor 32 becomes lower than the reference voltage $V_{ref}$. Consequently, the abnormal conduction detecting signal, indicating the abnormal conduction of the current conducted through the solenoid 22, is supplied to the output terminal 37 in low state.

Thus, the controlling circuit (not shown) is supplied with tile abnormal conduction detecting signal and stops permitting the current to conduct through the solenoid 22 and thereby prevents burning of the solenoid 22.

Since the above-mentioned conventional detecting circuit (1) consists of analog discrete components, the number of components is large, and it is difficult to miniaturize the conventional detecting circuit (1). Moreover, detection accuracy of the conventional detecting circuit (1) is affected by the accuracy of the time constant of the analog integrated circuit. In the conventional detecting circuit (1), even if the current conducts through the solenoid 4, if the collector voltage of the transistor 3 does not decrease to less than 5 V the abnormal conduction of the current conducted through the solenoid 4 is not detected. Consequently, a disadvantageous is presented in that when the abnormal conduction of the current through solenoid 4 is detected, the transistor 3 has already broken down or the solenoid 4 has already burned due to continuous current conduction through it.

In contrast, in the above-mentioned conventional detecting circuit (2), a short state, wherein the turn-on state of the transistor 21 is continuous or the collector-emitter voltage $V_{CE}$ has reached on 0–1.5 V, is detected, and the abnormal conduction detecting signal is output.

However, there is among the failure modes of the transistor 21 one wherein a half short state occurs between the collector-emitter. Because the conventional circuits cannot detect this state, the solenoid 22 burns, this being a serious disadvantage in the conventional art.

Furthermore, in the automatic performance piano using the conventional detecting circuit (2), the situation can occur where the power for the automatic performance plano as a whole remains on and unchanging, but the power supply voltage $V_{DD}$ applied to the solenoid 22 is turned off when the action of the automatic performance piano is stopped.

However, in the conventional detecting circuit (2), since the state where the power supply voltage $V_{DD}$ applied to the solenoid 22 is turned off is identical to the state where the transistor 21 is turned on as circuit action, the electric charge in the capacitor 32 is discharged via the resistors 30 and the diodes 26 and 25 and the transistor 21. Consequently, because the electric potential of the capacitor 32 is also lower than the reference voltage $V_{ref}$ in this case, the abnormal conduction detecting signal is supplied to the output terminal 37 in low state.

SUMMARY OF THE INVENTION

In consideration of the above, it is a first objective of the present invention to provide a circuit which can be miniaturized and integrated, the number of components in which can be decreased, the accuracy of which is not affected by the accuracy of its components and, moreover, which is capable of safely detecting the abnormal conduction of the current conducted through the solenoid. Additionally, it is a second object of the present invention to provide a circuit which detects abnormal conduction of the current conducted to the solenoid, which is capable of detecting the half short state of the transistor driving the solenoid and not malfunctioning even if the power is turned off.

So as to achieve the above stated object, the present invention provides a circuit for detecting abnormal conduction of the current conducted through a solenoid comprising a measuring means for detecting conduction current conducted through the solenoid in response to a pulse width modulation signal and measuring continuous conduction time of the conduction current, and a determining means which determines that a conduction is &n abnormal conduction in the case where the continuous conduction time is longer than a predetermined time.

With the above-mentioned circuit for detecting abnormal conduction of the current conducted through the solenoid in accordance with the present invention, the measuring means detects the conduction current conducted through the solenoid in response to the pulse width modulation signal and measures the continuous conduction time of the conduction current. Then, the determining means determines that a conduction is an abnormal conduction in the case where the continuous conduction time is longer than a predetermined time.

Therefore, by means of the present Invention, the number of the components can be decreased and miniaturization and integration are possible. In addition, since the measuring means detects the conduction current conducted through the solenoid and measures the continuous conduction time of the conduction current, it is capable of accurately detecting the continuous conduction state of the solenoid and its detection accuracy is not affected by the accuracy of the components. Moreover, it is capable of safely detecting the abnormal conduction of the current through the solenoid because the continuous conduction time is quantitatively measured and determined as the abnormal conduction based on the conduction current conducted through the solenoid.

Moreover, the present invention provides a circuit for detecting abnormal conduction of current conducted through a solenoid comprising a first charge-discharge means, for being charged or discharged in response to current conducted or not conducted through the solenoid In response to the pulse width modulation signal, a detecting means, for comparing electric potential of the first charge-discharge means with a predetermined electric potential to detect abnormal conduction of the current conducted through the solenoid, and a second charge-discharge means, for charging or discharging the first charge-discharge means in the case where a higher voltage than recommended is applied through the solenoid.

With the above-mentioned circuit for detecting abnormal conduction of the current conducted through the solenoid in accordance with the present Invention, when the current is or is not conducted through the solenoid in response to the pulse width modulation signal, the first charge-discharge means is charged or discharged in response to the current conducted or not conducted. Then, the detecting means compares the electric potential of the first charge-discharge means with a predetermined electric potential to detect the abnormal conduction of the current conducted through the solenoid. Thus, the second charge-discharge means charges or discharges the first charge-discharge means in the case where a higher voltage than recommended is applied to the solenoid.

Therefore, by means of the present invention, it is possible to detect the half short state of the transistor driving the solenoid. Accordingly, the detection range of the circuit for the detecting abnormal conduction of the current conducted through the solenoid becomes wide and it is possible to better prevent the burning of the solenoid as compared to the conventional circuit. Therefore, the reliability of the apparatus improves.

Furthermore, the present invention provides a circuit for detecting abnormal conduction of current conducted through a solenoid comprising a first charge-discharge means, for being charged or discharged in response to current conducted or not conducted through the solenoid in response to a pulse width modulation signal, a detecting means, for comparing the electric potential of the first charge-discharge means with a predetermined electric potential to detect the abnormal conduction of the solenoid, a second charge-discharge means, for charging or discharging the first charge-discharge means in the case where a higher voltage than recommended is applied to the solenoid, and a preventing means, for preventing charge or discharge to the first charge-discharge means in the case where the power supply voltage applied to the solenoid is turned off.

With the above-mentioned circuit for detecting abnormal conduction of the current conducted through the solenoid in accordance with the present invention, when the current is or is not conducted through the solenoid in response to the pulse width modulation signal, the first charge-discharge means is charged or discharged in response to the current conducted or not conducted. Then, the detecting means compares the electric potential of the first charge-discharge means with the predetermined electric potential to detect the abnormal conduction of the current conducted through the solenoid. Thus, the second charge-discharge means charges or discharges the first charge-discharge means in the case where a higher voltage than recommended is applied to the solenoid.

Furthermore, because the preventing means prevents the charge or the discharge to the first charge-discharge means when the power supply voltage applied to the solenoid is turned off, in this case, the detecting means does not detect the current conducted through the solenoid as an abnormal conduction.

Therefore, by means of the present invention, in the case where the power for the apparatus as a whole remains on and unchanging, but the power supply voltage applied to tile solenoid is turned off when the action of the apparatus is stopped, it is possible to distinguish between the time at which the solenoid is turned off and the time at which the solenoid is turned on, thereby avoiding the mistaken detection of a transistor short state for the circuit.

DETAILED DESCRIPTION OF THE PREFERRED EMBODIMENTS

First embodiment

Figure 1:
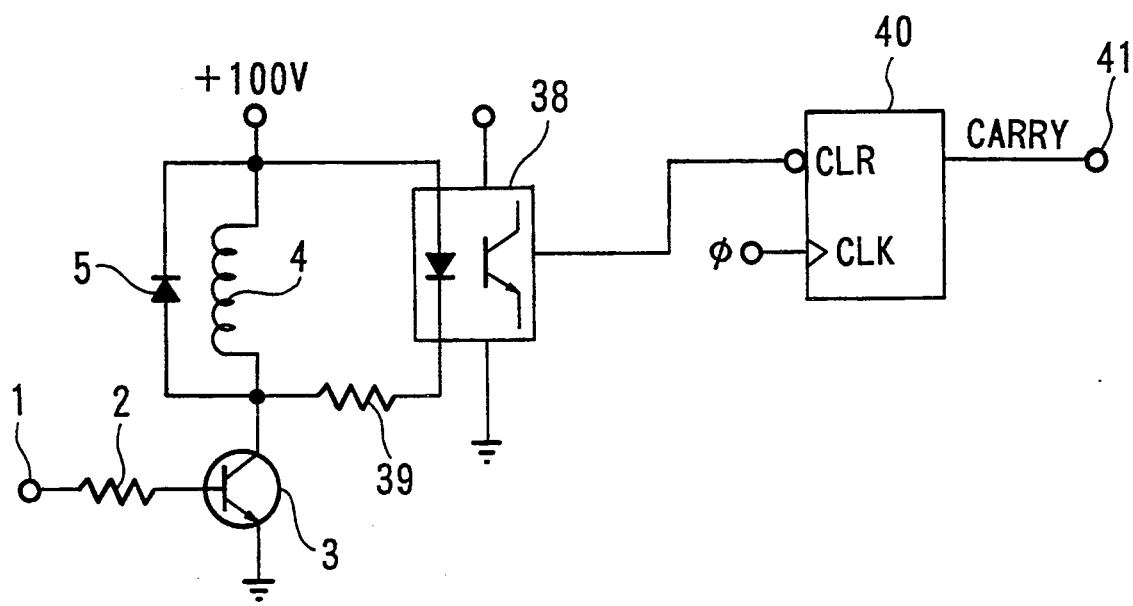
FIG. 1 is a circuit diagram showing the layout of a circuit for detecting abnormal conduction of a current conducted through a solenoid according to the first preferred embodiment of the present invention.
Figure 6:
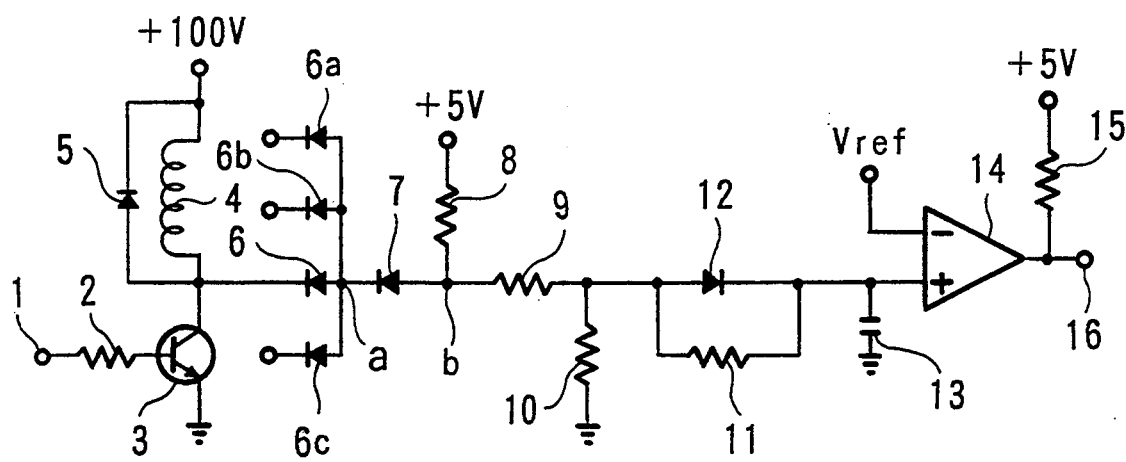
FIG. 6 is a circuit diagram showing the layout of a conventional circuit for detecting abnormal conduction of a current conducted through a solenoid.

Hereinafter, an explanation of a first preferred embodiment of the present invention will be given with reference to FIG. 1. In FIG. 1, components which correspond to components in the conventional detecting circuit (1) shown in FIG. 6 will retain time original identifying numeral, and their description will not be repeated.

As the diagram shows, photocoupler 38 made up of a light emitting diode and a phototransistor is provided and supplies a pulse signal in response to current conducted to the solenoid 4. An anode of the light emitting diode in photocoupler 38 connects to the other terminal of the solenoid 4 and the cathode of the diode 5. One terminal of a resistor 39 connects to one terminal of the solenoid 4 and the anode of the diode 5. The other terminal of the resistor 39 connects to a cathode of the light emitting diode in the phototransistor 38. The resistor 39 is a protector for protecting the photocoupler 38. A presetcounter 40 receives a pulse signal from the photocoupler 38 via a clear input terminal, and counts time while the pulse signal is in high state using a clock pulse signal of the required interval which is output from the clock pulse signal generating circuit (not shown). The preset count value is approximately a few minutes. The pulse width of the pulse width modulation signal is, for example, designed to be about 64µseconds. An output terminal 41 for the circuit for detecting abnormal conduction of the current conducted through the solenoid according to the first preferred embodiment of the present invention as a whole and, which is connected to a carry signal output terminal of the presetcounter 41, is provided.

Figure 7:
FIG. 7 shows a waveform of the pulse width modulation signal.
Figure 8:
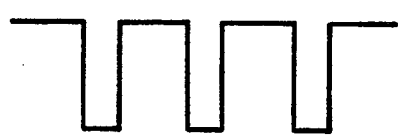
FIG. 8 shows a waveform of the collector voltage of the transistor 3 shown in FIG. 6.

Through the above described construction, when the pulse width modulation signal as shown in FIG. 7 is supplied to the input terminal 1, the transistor 3 is turned on or off in response to it, whereby the transistor 3 allows the current to be conducted through the solenoid 4 while the pulse width modulation signal supplied to the input terminal 1 is in high state.

When the features described in the preceding paragraph are carried out, the transistor 3 also allows the current to be conducted through the light emitting diode in the photocoupler 38 to emit the light while the same time as described above, that is, the light emitting diode emits the light in response to the current conducted through the solenoid 4. Accordingly, the phototransistor in the photocoupler 38 supplies a pulse signal in response to the current conducted through the solenoid 4.

Since the presetcounter 40 carries out counting operation only while the pulse signal is in high state, when the output pulse signal from the photocoupler 38 enters in low state, the presetcounter 40 stops the counting operation and clears the count value which it has counted up until that point. This count value of the presetcounter 40 corresponds to the continuous conduction time of the current conducted through the solenoid 4.

If the current goes on conducting through the solenoid for a time longer than the interval of tile pulse width modulation signal, whereby the time during which the pulse signal is in high state becomes longer than it is in normal state, tile presetcounter 40 carries out counting operation only while the pulse signal is in high state, then the presetcounter 40 counts up to the predetermined value (the preset value) and supples the carry signal via the carry signal output terminal. Consequently, this carry signal is supplied as the abnormal conduction detecting signal to the output terminal 41.

Thus, the controlling circuit (not shown) is supplied with the abnormal conduction detecting signal and stops permitting the current to conduct through the solenoid 4, thus preventing the burning of the solenoid 4.

With the circuit of the first preferred embodiment of the present invention, because the circuit consists of digital circuit components, it is possible to decrease the number of the components, and to carry out miniaturization and integration. In addition, since the detection of the conduction current conducted through the solenoid 4 is based not on the collector voltage of the transistor 3, but rather on the detection of the current flowing in the solenoid 4 itself, even if the transistor 3 does not completely become short state, provided that the current continuously conducts through the solenoid 4, it is possible to detect the abnormal conduction of tile current conducted through tile solenoid 4. Thus, since it is possible to prevent the damage of the transistor 3 and the burning of the solenoid 4 from occurring, the reliability for the detection of the abnormal conduction of the current conducted through the solenoid 4 is improved.

Second embodiment

Figure 2:
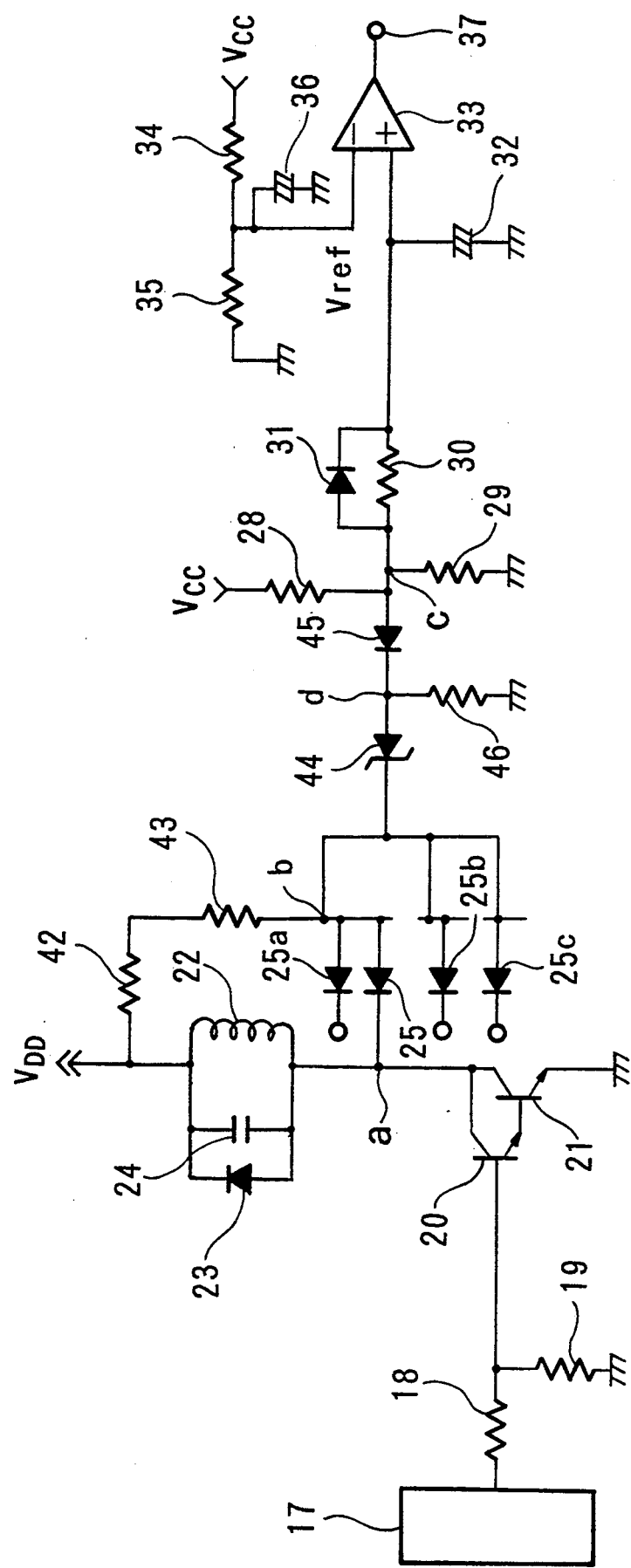
FIG. 2 is a circuit diagram showing the layout of a circuit for detecting abnormal conduction of a current conducted through a solenoid according to the second preferred embodiment of the present invention.
Figure 9:
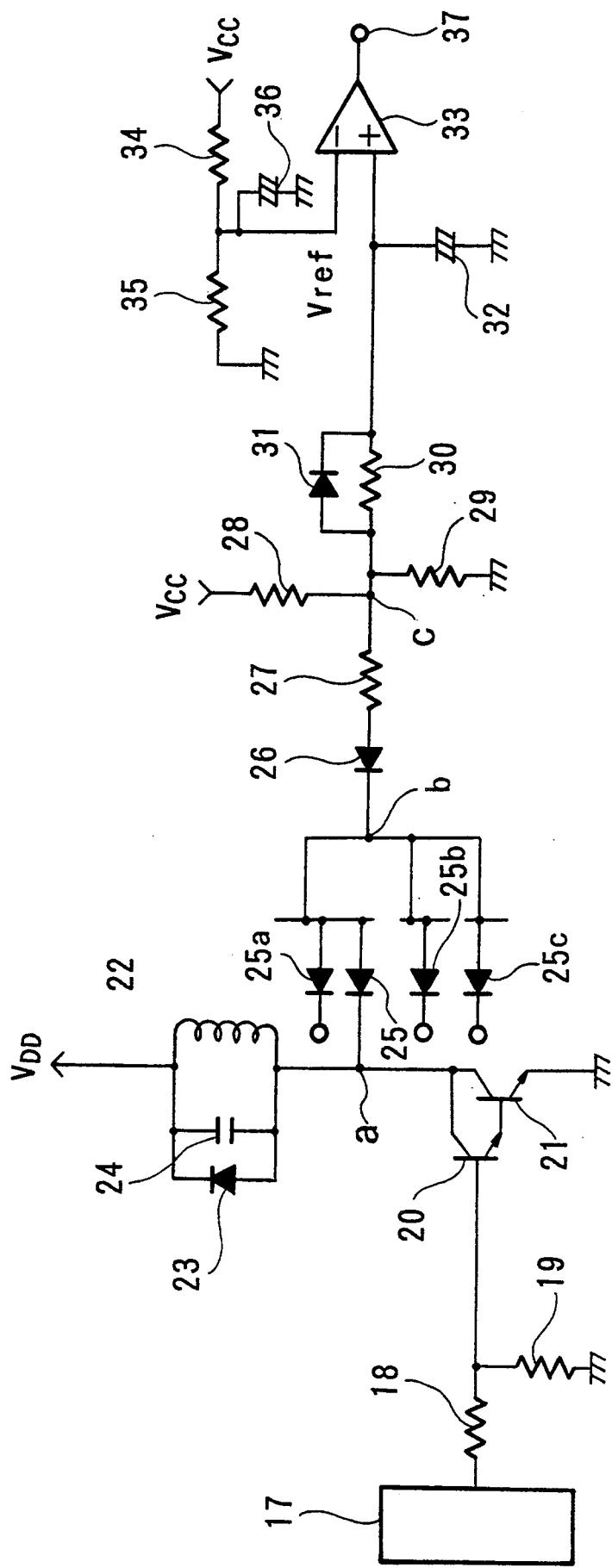
FIG. 9 is a circuit diagram showing the layout of other conventional circuit for detecting abnormal conduction of a current conducted through a solenoid.

Next, an explanation of a second preferred embodiment of the present invention will be given with reference to FIG. 2. In FIG. 2, components which correspond to components in the conventional detecting circuit (2) shown in FIG. 9 will retain the original identifying numeral, and their description will not be repeated.

As the diagram shows, resistors 42 and 43 are provided to be connected in series with respect to each other. One terminal of the resistor 42 connects to the other terminal of the solenoid 22 to which is applied power supply voltage $V_{DD}$, and one terminal of the resistor 43 connects to the terminal b. A voltage regulator diode 44 and a diode 45 are provided to be connected in series with respect to one other. A cathode of the voltage regulator diode 44 connects to the terminal b and an anode of the voltage regulator diode 44 connects to the cathode of the diode 45 and one terminal of a resistor 46, namely, a terminal d. The anode of the diode 45 connects to terminal c. The other terminal of the resistor 46 connects to the earth. The value of the resistor 46 is, for example, designed to be about a tenth of the sum value of the resistors 42 and 43. A critical voltage $V_Z$ of the voltage regulator diode 44 can be variably designed in response to the value of the collector-emitter voltage $V_{CE}$ of the transistor 21 and the value of the resistors 42, 43 and 46 can be variably designed in the same way.

Furthermore, in the case where the power supply voltage $V_{DD}$ is designed to be 120 V and the value of the collector-emitter voltage $V_{CE}$ of the transistor 21 in half short state is approximately 60 V, the voltage regulator diode, whose critical voltage $V_Z$ is approximately 75 V, is used as the voltage regulator diode 44. The values of the resistors 42, 43 and 46 are designed to be 12 kΩ, 10 kΩ and 2.2 kΩ, respectively.

Through the above described construction, when the pulse width modulation signal is generated by the pulse width modulation signal generating circuit 17, the transistors 20 and 21 are turned on or off in response to it, whereby the transistors 20 and 21 allow the current to conduct through the solenoid 22 while the pulse width modulation signal is in high state.

In this case, while tile transistor 21 is turned off, the diode 25 becomes nonconductive because an electric potential at terminal a, namely, a collector electric potential of the transistor 21 becomes approximately equal to the power supply voltage $V_{DD}$ (120 V). The electric potential at terminal b is the sum (approximately 79.1 V) of the critical voltage $V_Z$ (approximately 75 V) of the voltage regulator diode 44 and of the result value (approximately 4.09 V) of voltage resistor 46 and voltage resistors 42 and 43, for which the critical voltage $V_Z$ of voltage regulator diode 44 is subtracted from power supply voltage $V_{DD}$ (120 V).

Furthermore, while the transistor 21 is turned off, the diode 45 becomes nonconductive because the electric potential at terminal d is the result value (approximately 4.09 V) of voltage resistor 46 and voltage resistors 42 and 43, for which the critical voltage $V_Z$ of voltage regulator diode 44 is subtracted from power supply voltage $V_{DD}$ (120 V) and the electric potential at terminal c is the result value (about 4.78 V) which the power supply voltage $V_{cc}$ (5 V) is divided by the resistors 28 and 29.

Accordingly, In response to an electric potential across both ends of the resistor 28, the diode 31 and the capacitor 32 serially-connected, that is, in response to the power supply voltage $V_{cc}$ (5 V), an electric charge is accumulated in the capacitor 32. In this case, a charge time is approximately equal to the time constant determined by the value of the resistor 28 and the capacitor 32, respectively.

In contrast, while the transistor 21 is turned on, the diodes 25 becomes conductive because electric potential at terminal a, namely, the collector electric potential of the transistor 21 becomes approximately equal to 0 V, but the electric potential at terminal b remains unchanged and equal to the sum (approximately 79.1 V) of the critical voltage $V_Z$ (approximately 75 V) of the voltage regulator diode 44 and of the result value (approximately 4.09 V) of voltage resistor 46 and voltage resistors 42 and 43, for which the critical voltage $V_Z$ of voltage regulator diode 44 is subtracted from power supply voltage $V_{DD}$ (120 V).

Accordingly, because the electric potential at terminal b is approximately 0.7 V, a reverse current ceases to conduct through the voltage regulator diode 44.

In contrast, since the electric potential at terminal c remains unchanged and approximately equal to result value (approximately 4.78 V) which is divided by the resistors 28 and 29 of the power supply voltage $V_{cc}$ (5 V), the diodes 45 becomes conductive and a forward current conducts through the voltage regulator diode 44.

Thus, because the electric potential at terminal c becomes approximately equal to the total value (approximately 2.1 V) of the forward voltages of the diodes 25 and 45 and the voltage regulator diode 44, respectively, the electric charge charged in the capacitor 32 while the transistor 21 is turned off, is discharged via the resistor 30, tile diode 45 and the resistor 46. In this case, the discharge time is approximately equal to the time constant determined by the value of the resistor 30 and the capacitor 32, respectively.

In the normal case, since the charge and discharge operation in the capacitor 32 described above are repeatedly in response to the pulse width modulation signal output from the pulse width modulation signal generating circuit 17, the electric potential of the capacitor 32 is always more than the predetermined reference voltage $V_{ref}$ (approximately 2.7 V). Consequently, the signal representative of the normal conduction of the current conducted through the solenoid 22 is supplied to the output terminal 37 in high state.

However, if for whatever reason, short state or turn-on state in the transistor 21 continues, namely the current goes on flowing through the solenoid 22 for a long time, since tile discharge time of the capacitor 32 becomes longer than in the normal state, the electric potential of tile capacitor 32 is less than the reference voltage $V_{ref}$. Consequently, the abnormal conduction detecting signal indicating the abnormal conduction of the current conducted through the solenoid 22, is supplied to the output terminal 37 in low state.

Thus, controlling circuit (not shown) is supplied with the abnormal conduction detecting signal and stops permitting the current to be conducted through the solenoid 22, thus preventing the burning of the solenoid 22.

In addition, in the case where for whatever reason, tile transistor 21 enters a half short state, namely, the transistor 21 has some value of resistance between the collector and the emitter and the value of the collector-emitter voltage $V_{CE}$ of the transistor 21 is, for example, approximately 60 V, the voltage of more than approximately 40 V may be applied to between both ends of the solenoid 22. In this case, it is possible that the solenoid 22 will burn because the solenoid 22 becomes heated.

Therefore, the circuit of the second preferred embodiment of the present invention prevents burning of the solenoid 22 as follows.

In the case where, for whatever reason, the transistor 21 enters a half short state and the collector electric potential of the transistor 21, namely, the electric potential at terminal a, is approximately 60 V, since the electric potential at terminal b remains unchanged and equal to the sum (approximately 79.1 V) of the critical voltage $V_Z$ (approximately 75 V) of the voltage regulator diode 44 and the result value (approximately 4.09 V) of voltage resistor 46 and voltage resistors 42 and 43, for which the critical voltage $V_Z$ of voltage regulator diode 44 is subtracted from power supply voltage $V_{DD}$ (120 V), the diode 25 becomes conductive.

Accordingly, because the electric potential at terminal b is approximately 60 V, the reverse current ceases to conduct through the voltage regulator diode 44.

In contrast, since the electric potential at terminal c remains unchanged and approximately equal to result value (approximately 4.78 V) which is divided by the resistors 28 and 29 of the power supply voltage $V_{cc}$ (5 V), the diodes 45 becomes conductive and no current is conducted through the voltage regulator diode 44.

Thus, because the electric potential at terminal c becomes approximately equal to the result value (approximately 1.3 V) determined by the resistors 28 and 46 and the diode 45, the electric charge charged in the capacitor 32 is discharged via the resistor 30, the diode 45 and the resistor 46. Then, if the half short state in the transistor 21 continues for longer than a set time, since the electric potential of the capacitor 32 is less than the reference voltage $V_{ref}$, the abnormal conduction detecting signal indicating the abnormal conduction of the current conducted through the solenoid 22, is supplied to the output terminal 37 in low state.

Thus, the controlling circuit (not shown) Is supplied with the abnormal conduction detecting signal and stops permitting the current to conduct through the solenoid 22, thus preventing the burning of tile solenoid 22.

Third embodiment

Figure 3:
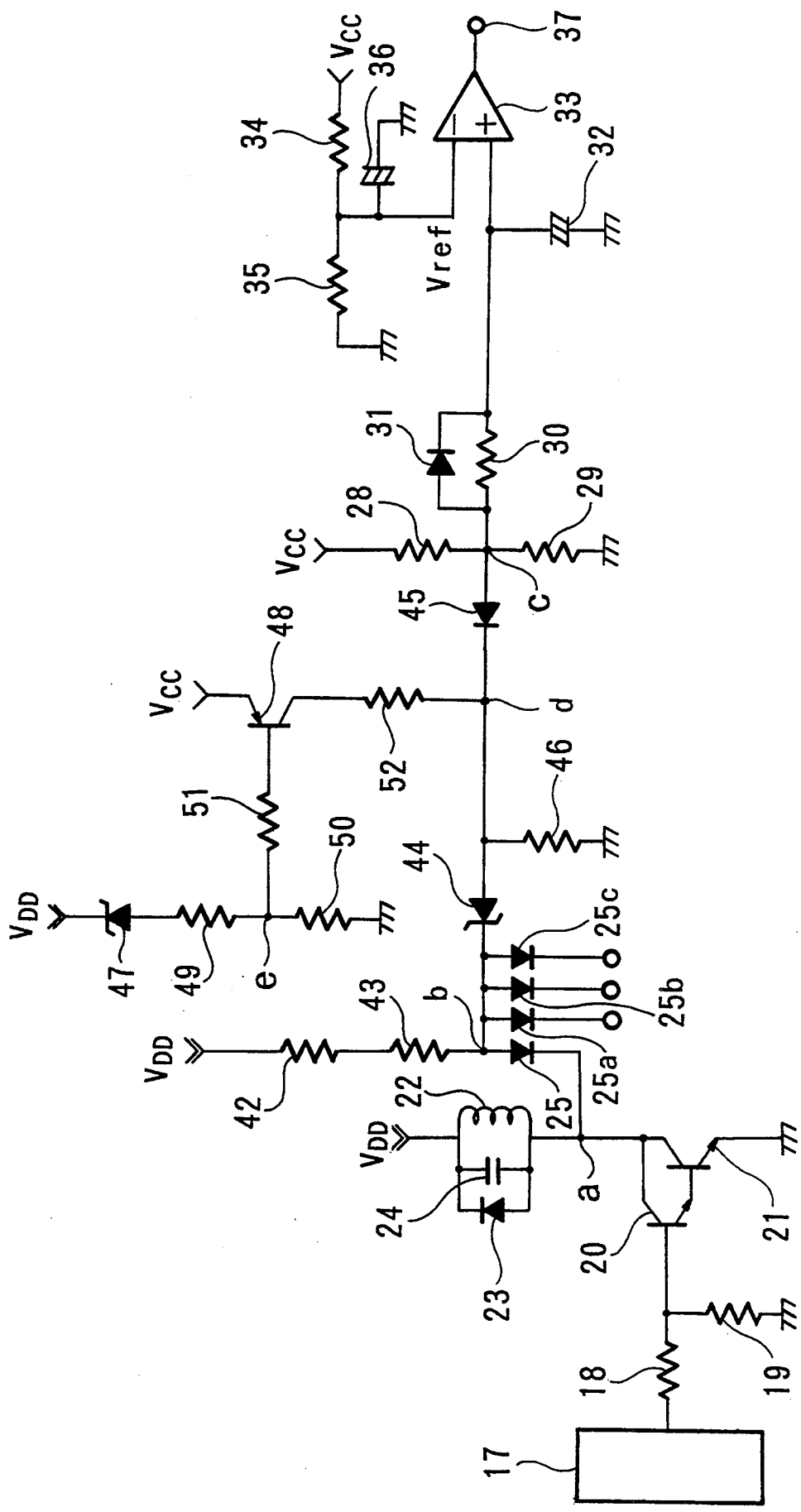
FIG. 3 is a circuit diagram showing the layout of a circuit for detecting abnormal conduction of a current conducted through a solenoid according to the third preferred embodiment of the present invention.

Next, an explanation of a third preferred embodiment of the present invention will be given with reference to the figures. FIG. 3 is a circuit diagram showing the layout of a circuit for detecting abnormal conduction of a current conducted through a solenoid according to the third preferred embodiment of the present invention. In FIG. 3, components which correspond to components in the circuit of the second preferred embodiment of tile present invention shown in FIG. 2 will retain the original identifying numeral, and their description will not be repeated.

As the diagram shows, a voltage regulator diode 47 is provided and the power supply voltage $V_{DD}$ is applied to its cathode. The critical voltage $V_Z$ of the voltage regulator diode 47 is equal to that of the voltage regulator diode 44. Furthermore, a PNP type transistor 48 is provided and a power supply voltage $V_{cc}$ is applied to its emitter. Resistors 49 through 51 &re provided to apply a bias voltage to the transistor 48 and are for making the transistor 48 operate at the required operation point when the power supply voltage $V_{DD}$ is shut off. The anode of the voltage regulator diode 47 connects to one terminal of the resistor 49. The other terminal of the resistor 49 connects to one terminal of the resistor 50 and to one terminal of the resistor 51, that is to say, terminal e. The terminal of the resistor 50 connects to the earth. The other terminal of the resistor 51 connects to the base of the transistor 48. A collector of the transistor 48 connects to one terminal of the resistor 52 and the other terminal of the resistor 52 connects to the terminal d. In this embodiment, the transistor 48 is exemplified, by a transistor having such characteristics as a typical value of $-0.6$ V for the value of the base-emitter voltage $V_{BE}$, a typical value of $-0.07$ V for the value of the collector-emitter voltage $V_{CE}$, a typical value of 200 for the value of the direct current ratio $h_{FE}$, and a maximum value of $-5$ V for the value of the emitter-base voltage $V_{EBO}$.

Furthermore, in the ease where the power supply voltage $V_{DD}$ is designed to be 120 V and the value of the collector-emitter voltage $V_{CE}$ of the transistor 21 in half short state, is 62.7 V, the voltage regulator diode whose critical voltage $V_Z$ is approximately 62 V is used as the voltage regulator diodes 44 and 47. The value of the resistors 42, 43 and 46 are designed to be 12 kΩ, 10 kΩ and 2.7 kΩ, respectively. The value of the resistors 49 through 52 are designed to be 15 kΩ, 2.7 kΩ, 1 kΩ and 1 kΩ, respectively.

Through the above described construction, when the pulse width modulation signal is generated by tile pulse width modulation signal generating circuit 17, the transistors 20 and 21 are turned on or off in response to it, whereby the transistors 20 and 21 allow the current to conduct through the solenoid 22 while the pulse width modulation signal is in high state.

In this case, while the transistor 21 is turned off, the diode 25 is nonconductive because the electric potential at terminal a, namely, a collector electric potential of the transistor 21, becomes approximately equal to the power supply voltage $V_{DD}$ (120 V), and the electric potential at terminal b becomes approximately equal to the sum (approximately 68.3 V) of the critical voltage $V_Z$ (approximately 62 V) of the voltage regulator diode 44 and the result value (approximately 6.3 V) of voltage resistor 46 and voltage resisters 42 and 43, for which the critical voltage $V_Z$ of voltage regulator diode 44 is subtracted from power supply voltage $V_{DD}$ (120 V).

Furthermore, while the transistor 21 is turned off, the diode 45 becomes nonconductive because the electric potential at terminal d becomes approximately equal to the result value (approximately 6.3 V) of voltage resistor 46 and voltage resisters 42 and 43, for which the critical voltage $V_Z$ of voltage regulator diode 44 is subtracted from power supply voltage $V_{DD}$ (120 V) and the electric potential at terminal c becomes approximately equal to the result value (approximately 4.78 V) which is divided by the resisters 28 and 29 of the power supply voltage $V_{cc}$ (5 V).

Accordingly, in response to an electric potential across both ends of the resistor 28, the diode 31 and the capacitor 32 are serially-connected, that is, in response to the power supply voltage $V_{cc}$ (5 V), an electric charge is accumulated in the capacitor 32. In this case, the charge time is approximately equal to the time constant determined by tile value of the resistor 28 and the capacitor 32, respectively.

At the same time, because the electric potential at terminal e is approximately equal to result value (approximately 8.8 V) of voltage resistors 49 and 50 for which the critical voltage $V_Z$ of voltage regulator diode 47 is subtracted from power supply voltage $V_{DD}$ (120 V), and a power supply voltage $V_{cc}$ (5 V) is supplied to the emitter of the transistor 48. Therefore, because the base-emitter voltage $V_{BE}$ of the transistor 48 is approximately equal to the result value (approximately 3.8 V) which the power supply voltage $V_{cc}$ (5 V) from the electric potential (approximately 8.8 V) at terminal e, the transistor 48 is shut off.

In contrast, while the transistor 21 is turned on, the diodes 25 becomes conductive because electric potential at terminal a, namely, the collector electric potential of the transistor 21 becomes approximately equal to 0 V, but the electric potential at terminal b remains unchanged and equal to the sum (approximately 68.3 V) of the critical voltage $V_Z$ (approximately 62 V) of the voltage regulator diode 44 and result value (approximately 6.3 V) of voltage resistor 46 and voltage resistors 42 and 43, for which the critical voltage $V_z$ of voltage regulator diode 44 is subtracted from power supply voltage $V_{DD}$ (120 V).

Accordingly, because the electric potential at terminal b is approximately 0.7 V, a reverse current ceases to conduct through the voltage regulator diode 44.

In contrast, since the electric potential at terminal c remains unchanged and equal to the result value (approximately 4.78 V) for which the power supply voltage $V_{cc}$ (5 V) is divided by the resistors 28 and 29, the diodes 45 becomes conductive and a forward current begins to conduct through the voltage regulator diode 44.

Thus, because the electric potential at terminal e becomes approximately equal to the result value (approximately 2.1 V) resulting from the addition of the forward voltages of the diodes 25 and 45 and the voltage regulator diode 44, respectively, the electric charge charged in the capacitor 32 while the transistor 21 is turned off, is discharged via the resistor 30, the diode 45 and the resistor 46. In this case, discharge time is approximately equal to the time constant determined by the value of the resistor 30 and the capacitor 32, respectively.

At the same time, because electric potential at terminal e is approximately equal to result value (approximately 8.8 V) of voltage resistors 49 and 50, for which the critical voltage $V_Z$ of voltage regulator diode 47 is subtracted from power supply voltage $V_{DD}$ (120 V), and a power supply voltage $V_{cc}$ (5 V) is applied to the emitter of the transistor 48. Therefore, because the base-emitter voltage $V_{BE}$ of the transistor 48 is approximately equal to result value (approximately 3.8 V) which is result from deducting the power supply voltage $V_{cc}$ (5 V) from the electric potential (approximately 8.8 V) at terminal e, the transistor 48 remained unchanged and shut off.

In the normal case, since the charge and discharge operation in the capacitor 32 described above is repeated in response to the pulse width modulation signal output from the pulse width modulation signal generating circuit 17, the electric potential of the capacitor 32 is always more than predetermined reference voltage $V_{ref}$ (approximately 2.7 V). Consequently, the signal representative of tile normal conduction of tile current through the solenoid 22, is supplied to the output terminal 37 in high state.

However, if, for whatever reason, short state or turn-on state in the transistor 21 continues, namely current goes on flowing through the solenoid 22 for a long time, since the discharge time of the capacitor 32 becomes longer than it is in normal state, the electric potential of the capacitor 32 is less than the reference voltage $V_{ref}$. Consequently, the abnormal conduction detecting signal representative of the abnormal conduction of the current conducted through the solenoid 22, is supplied to the output terminal 37 In low state.

Thus, the controlling circuit (not shown) is supplied with the abnormal conduction detecting signal and stops permitting the current to conduct through the solenoid 22, thus preventing the burning of the solenoid 22.

In addition, as shown in FIG. 3, in the case where, for whatever reason, the transistor 21 enters in half short state, and the collector electric potential of the transistor 21, namely the electric potential at terminal a, becomes, for example, 62.7 V at time $t_1$, down from 120 V, because a voltage of more than approximately 57 V may be applied to between both ends of the solenoid 22, the solenoid 22 is heated.

At the same time, since the electric potential at terminal b remained unchanged and equal to the sum (approximately 68.3 V) of the critical voltage $V_Z$ (approximately 62 V) of the voltage regulator diode 44 and result value (approximately 6.3 V) of voltage resistor 46 and voltage resistors 42 and 43, for which the critical voltage $V_Z$ of voltage regulator diode 44 is subtracted from power supply voltage $V_{DD}$ (120 V), the diode 25 becomes conductive.

Accordingly, because the electric potential at terminal b is approximately 63.4 V, the reverse current ceases not to conduct through the voltage regulator diode 44.

In contrast, since the electric potential at terminal c remains unchanged and equal to the result value (approximately 4.78 V) for which the power supply voltage $V_{cc}$ (5 V) is divided by the resistors 28 and 29, the diode 45 becomes conductive and no current is conducted through the voltage regulator diode 44.

Figure 4:
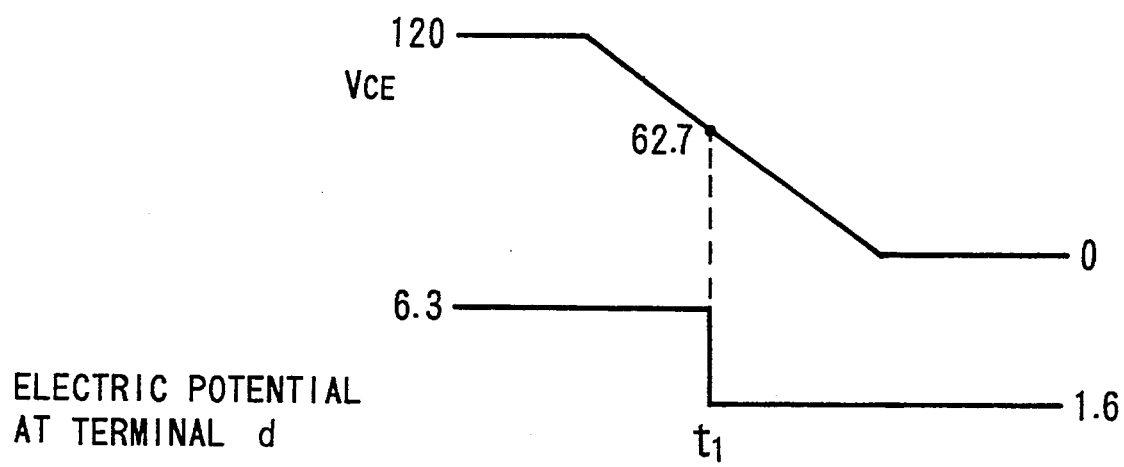
FIG. 4 shows voltages varied in response to the action of the circuit shown in FIG. 3.

Thus, because the electric potential at terminal d becomes approximately equal to the result value (approximately 1.6 V) determined by the resistors 28 and 46 and the diode 45, as shown in FIG. 4, and the electric potential at terminal c becomes approximately 2.3 V, the electric charge charged in the capacitor 32 is discharged via the resistor 30, the diode 45 and the resistor 46. Then, if the half short state in the transistor 21 continues for more than a fixed length of time, since the electric potential of the capacitor 32 is less than the reference voltage $V_{ref}$, the abnormal conduction detecting signal indicating the abnormal conduction of the current through the solenoid 22, is supplied to the output terminal 37 in low state.

Thus, the controlling circuit (not shown) is supplied with the abnormal conduction detecting signal and stops permitting the current to conduct through the solenoid 22, thus preventing the burning of the solenoid 22.

At the same time, because the electric potential at terminal e is approximately equal to result value (approximately 8.8 V) of voltage resistors 49 and 50, for which the critical voltage $V_Z$ of voltage regulator diode 47 is subtracted from power supply voltage $V_{DD}$ (120 V), and the power supply voltage $V_{cc}$ (5 V) is applied to the emitter of the transistor 48. Therefore, because the base-emitter voltage $V_{BE}$ of the transistor 48 is approximately equal to result value (approximately 3.8 V) which results from deducting the power supply voltage $V_{cc}$ (5 V) from the electric potential (approximately 8.8 V) at terminal e, the transistor 48 remained unchanged and shut off.

In an automatic performance piano using the circuit of this embodiment of the present invention, there are cases where the power for the automatic performance piano as a whole remains on and unchanging, but the power supply voltage $V_{DD}$ applied through the solenoid is turned off when the action of the automatic performance piano is stopped.

Figure 5:
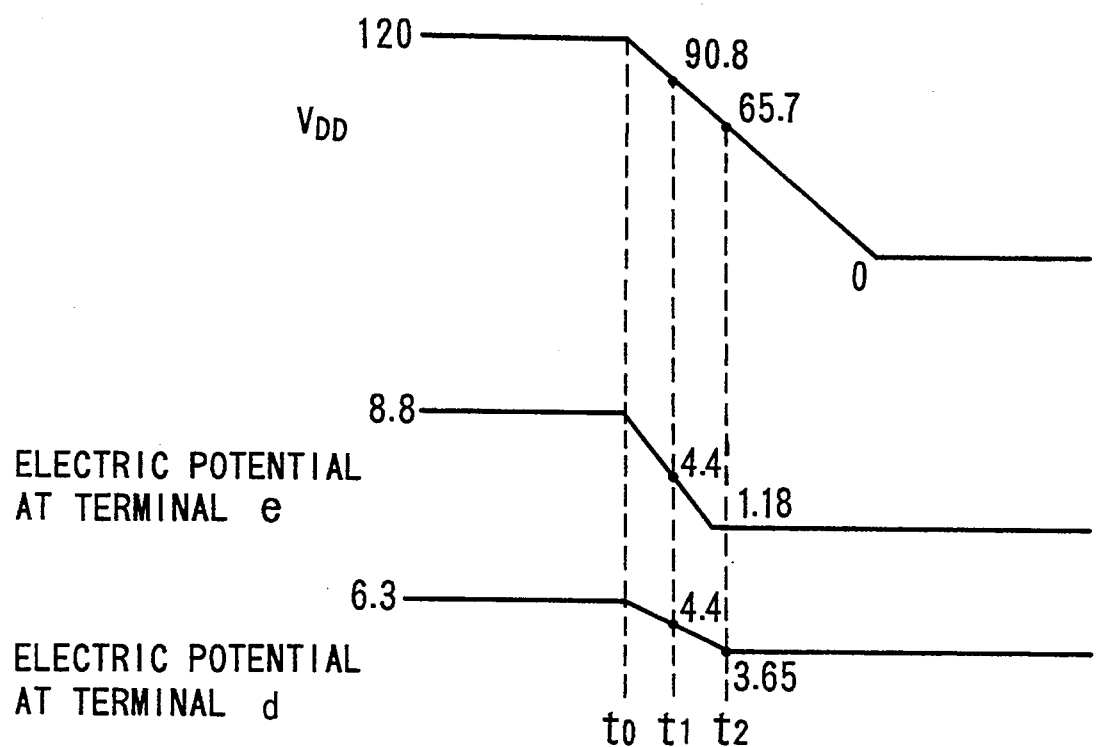
FIG. 5 shows voltages varied in response to the action of the circuit shown in FIG. 3.

Next, an explanation of a third preferred embodiment of the present invention in such a case will be given with reference to the figures. As shown in FIG. 5, when the power supply voltage $V_{DD}$ applied through the solenoid 22 is turned off at time $t_0$, the power supply voltage $V_{DD}$ decrease gradually from 120 V toward 0 V and, at the same time, the electric potential at terminal a, namely, the collector electric potential of the transistor 21, also decreases gradually from 120 V toward 0 V, if the period just before when the power supply voltage $V_{DD}$ is turned off is the period during which the transistor 21 is turned off.

Moreover, because the electric potential at terminal b decreases gradually from 68.3 V toward 0 V in response to the gradual decrease in the power supply voltage $V_{DD}$ from 120 V toward 0 V, when the power supply voltage $V_{DD}$ decreases to 65.7 V, that is, at time $t_2$, the reverse current ceases to conduct through the voltage regulator diode 44, as is shown in FIG. 5.

As shown in FIG. 5, the electric potential at terminal e decreases gradually from 8.8 V toward 0 V in response to the gradual decrease in the power supply voltage $V_{DD}$ from 120 V toward 0 V, but when the electric potential at terminal e decreases to 4.4 V, the base-emitter voltage $V_{BE}$ of the transistor 48 becomes approximately equal to result value (approximately $-0.6$ V) which results from the deduction of the power supply voltage $V_{cc}$ (5 V) from the electric potential (approximately 4.4 V) at terminal e. Thus, the transistor 48 becomes turned on at time $t_1$ as shown in FIG. 1.

Accordingly, the collector current of the transistor 48 conducts toward the terminal e, thereby the decrease in the electric potential at terminal e stops and does not decrease beyond 3.65 V.

Therefore, because the electric potential of the capacitor 32 is not less than the reference voltage $V_{ref}$, the abnormal conduction detecting signal, indicating that the conduction in solenoid 22 is abnormal, is not supplied to the output terminal 37 in low state.

What is claimed is:

1. A circuit for detecting abnormal conduction of current conducted through a solenoid comprising;

a first means for receiving a charge and discharging a charge, said first means being at least one of charged and discharged in response to said current conduction by said solenoid, said solenoid conducting said current in response to a pulse width modulation signal;

detecting means for comparing the electric potential of said first means with a predetermined electric potential to detect said abnormal conduction of current in said solenoid;

second means for at least one of charging and discharging said first means when a voltage greater than a predetermined amount is applied to said solenoid; and preventing means for preventing at least one of the charge and discharge of said first means when a power supply voltage applied to said solenoid is turned off.

2. The circuit according to claim 1, further comprising:

measuring through said solenoid, said measuring means including time measuring means for measuring a continuous conduction time of said conduction current; and determining means for determining when said continuous conduction time is longer than a predetermined time.

\* \* \* \* \*